United States Patent [19]
Cox et al.

[11] Patent Number: 5,807,610
[45] Date of Patent: Sep. 15, 1998

[54] FLEX TAB THICK FILM METAL MASK TO DEPOSIT COATING MATERIAL

[75] Inventors: Harry David Cox, Rifton; Connie Fassett Littell, Poughkeepsie; Richard Michael Shroedl, Staatsburg; John Amodio Trumpetto, Hopewell Junction; Michael Stephen Vanca, Wappingers Falls, all of N.Y.

[73] Assignee: International Business Machines Corporation, Armonk, N.Y.

[21] Appl. No.: 831,357

[22] Filed: Apr. 1, 1997

Related U.S. Application Data

[62] Division of Ser. No. 430,042, Apr. 27, 1995, Pat. No. 5,669,972.

[51] Int. Cl.$^6$ .................................................. B05D 1/32
[52] U.S. Cl. ............................................ 427/256; 427/282
[58] Field of Search ................................. 427/256, 282; 118/213, 301, 406, 504, 505; 101/127

[56] References Cited

U.S. PATENT DOCUMENTS

| | | | |
|---|---|---|---|
| 3,486,441 | 12/1969 | Hillman et al. | 101/35 |
| 3,769,908 | 11/1973 | Griffin | 101/127 |
| 3,949,667 | 4/1976 | Zimmer | 101/119 |
| 4,084,506 | 4/1978 | Nakatani | 101/127 |
| 4,245,273 | 1/1981 | Feinberg et al. | 361/382 |
| 4,362,486 | 12/1982 | Davis et al. | 425/110 |
| 4,615,781 | 10/1986 | Boudreau | 204/192.15 |
| 4,715,940 | 12/1987 | Boudreau | 204/192.1 |
| 4,784,310 | 11/1988 | Metzger et al. | 228/123 |
| 4,791,110 | 12/1988 | Arnold et al. | 514/247 |
| 4,803,110 | 2/1989 | Ahn et al. | 428/137 |
| 4,902,371 | 2/1990 | Andris et al. | 156/344 |
| 4,919,970 | 4/1990 | Hoebener et al. | 427/96 |
| 5,003,870 | 4/1991 | Isaak | 101/127.1 |
| 5,249,520 | 10/1993 | Andris et al. | 101/126 |

FOREIGN PATENT DOCUMENTS 60-234877  11/1985  Japan.

OTHER PUBLICATIONS

IBM Technical Disclosure Bulletin, vol. 6, No. 4, Sep. 1963, "Extrusion Printing Apparatus", Camuzat et al.
IBM Technical Disclosure Bulletin, vol. 12, No. 12, May 1970, "Meshless Moly–Mask", Kutch et al.
IBM Technical Disclosure Bulletin, vol. 18, No. 4, Sep. 1975, "Mask Design for Complex Pattern Paste Application", Byrne.
IBM Technical Discloure Bulletin, vol. 19, No. 3, Aug. 1976 "Screening Mask", Gibney et al.
IBM Technical Disclosure Bulletin, vol. 19, No. 5, Oct. 1976, "Metal–Mask Fabrication from Etched Dislad", Gibney et al.

*Primary Examiner*—Shrive P. Beck
*Assistant Examiner*—Fred J. Parker
*Attorney, Agent, or Firm*—DeLio & Peterson, LLC; John J. Tomaszewski; Ira D. Blecker

[57] ABSTRACT

A mask for printing a pattern on a substrate comprises a sheet preferably of metal having a printing pattern thereon comprising through mask openings in the sheet. The through mask openings are interconnected by tabs or bridges which have a structure which provides a bending moment in a portion of the tab when a force is applied to the mask to force material to be deposited on the substrate through the mask openings. A preferred tab structure has a step shape and at least one through opening in the tab. The step shape and through mask opening both provide bending moments in the tab and the through opening also provides enhanced patterning definition because the deposition material flows both under the tab and through the through tab opening. The masks have a longer operating life than conventional masks and enhanced operating characteristics.

11 Claims, 3 Drawing Sheets

FLEX TAB THICK FILM METAL MASK TO DEPOSIT COATING MATERIAL

This is a divisional of application Ser. No. 08/430,042 filed on Apr. 27, 1995 now U.S. Pat. No. 5,669,972.

BACKGROUND OF THE INVENTION

1. Field of the Invention

The present invention relates generally to masks and to processes for using the masks to make patterns on substrates and, in particular, to a specially designed mask for making electronic circuit patterns on a substrate the mask having flexible line tabs which relieve stress on the mask during the patterning process, extends the operational life of the mask and provides enhanced patterning of the substrate.

2. Description of Related Art

The use of a separate mask or template or stencil to control the pattern of a material deposition on a portion of a structure is well known. In general, openings are provided in the sheet of mask material in a pattern which corresponds to the desired pattern to be imparted onto the structure. The mask is placed against the structure surface and deposition on the selected portions of the substrate through the mask openings are made by applying to the mask surface a material to be deposited on the surface of the substrate and forcing the material through the openings. Typical structures on which material depositions are made in a variety of patterns and forms are integrated circuit wafers, greensheets, and substrates which are used to mount thereupon various kinds of electronic devices.

The mask may be made from any material or laminate material and is typically made from a single homogeneous metal sheet of copper, aluminum or molybdenum or alloys thereof. The mask is preferably molybdenum and is generally thin, e.g., about 0.001 to 0.020 inch.

Multiple layer ceramic (MLC) semiconductor packages have been formed by stacking and bonding together flexible paper like sheets commonly referred to as ceramic greensheets. Greensheet segments of desired size and configuration are punched to provide via holes and, by a screen printing technique using a mask, a conductive paste fills the via holes and/or a conductive circuit pattern is applied to the face of a greensheet as required. Such greensheets, after screening, are generally assembled in a stack, pressed and subsequently sintered in an oven at a relatively high temperature. Upon sintering, the vehicle and any binding material are burned out with the remaining rigid unitary ceramic body provided with interior interconnected conductive patterns produced by the screening process.

Critical to the manufacturing process of such substrates is the patterning operation since, for example, the ceramic greensheets are relatively fragile and the masks used in the patterning operation are likewise fragile. In general, with the mask in place and with a greensheet positioned immediately beneath the mask and in contact therewith, patterning of the greensheet is accomplished by forced extrusion of paste through the mask pattern holes to fill via holes within the greensheet and/or produce a surface pattern on the greensheet.

There are basically three (3) masks which may be employed for screen printing. An emulsion mask made by applying a photosensitive resin to a mesh made of synthetic fiber or stainless steel or the like and then removing resin applied from unwanted portions other than portions exposed according to an exposure process. A metal-mesh mask made by depositing a metal foil on a stainless mesh using an electroplating process and then subjecting part of the metal foil to pattern etching. A solid metal mask made by forming a printed pattern layer on a substrate metal foil and etching away the unwanted metal forming the pattern. In each case, there is provided a mask having openings which are arranged in a pattern to be deposited on the greensheet.

For convenience, the following description will be directed to solid metal masks used for thick film screening processes although it will be appreciated by those skilled in the art that the invention could be used for other mask devices and deposition processes.

Although the mask may contain various designs thereon one of the most common and repetitive layer designs used for electronic devices are signal layers. These layers are long thin conductive lines and require a metal mask pattern having corresponding long thin openings. Such a mask uses line tabs or bridges to tie the etched line cavity in the mask together and to reinforce and strengthen the mask. Without these line tabs the integrity of the line would be compromised due to the forces exerted during the deposition process. The number of tabs in a mask varies but generally for a line deposition design the mask has tabs spaced at intervals to provide a tab area to open line area of about 5–10% to 50%.

Tab designs are of a generally rectangular shape of uniform dimension repeated at regular intervals along the etched lined cavity which tab is coplanar with the upper surface of the mask and which is of a thickness less than the thickness of the mask to form an opening between the surface of the substrate to be patterned and the lower surface of the line tab. Screening paste or other such deposition material is then applied to the mask surface and forced into the line openings with the material flowing under the tabs (or bridges) to make the desired continuous long thin line. Unfortunately, this uniform shaped tab is easily sheared or fractured by the downward force of the screening paste nozzle or other procedures used during the patterning process (e.g., squeegee) and once one tab fails, the entire mask is essentially useless and must be scrapped. This failure mechanism is probably the single greatest reason for rejecting greensheets made by screening processes.

In U.S. Pat. Nos. 4,615,781 and 4,715,940 to Robert A. Boudreau a mask is provided for patterning thin-film structures for a thin film device. This invention is stated to be particularly suited for a mask design to provide a fine pattern of closely spaced parallel lines for electrode structures and consists of a plurality of metallic strips having a series of interconnecting small arched bridges that hold the strips of the mask together. This type design, while suitable for thin-film deposition processes such an sputtering, vapor deposition or chemical vapor deposition, does not solve the problems associated with tab or bridge failure during patterning processes used in, e.g., thick film processes where a greater amount of force is applied to the mask surface. The forces generated during thick film screening processes are usually much greater than in thin film processes and the strength of the tabs is generally not sufficient for long and economical use of the mask due to tab breakage.

In U.S. Pat. No. 4,362,486 to Davis et al. an automatic MLC screening machine is shown wherein greensheets are transferred to a screening station for paste screening by forced extrusion of paste from a paste tube through a mask. Molybdenum paste is screened through the stencil masks and the paste is said to have a consistency somewhere between that of tar and putty. In U.S. Pat. No. 4,919,970 solder paste is shown deposited through a mask or screen using a squeegee blade which passes over the surface of the mask forcing the paste into the mask openings and onto the substrate to be pasted. The masks are described as being preferably made of a metallic alloy such as beryllium copper having a thickness of about 10 to 12 mils. U.S. Pat. No. 4,902,371 describes a typical greensheet screening operation and notes that the material to be deposited usually has a high degree of viscosity. The disclosures of the above patents are hereby incorporated by reference.

Bearing in mind the problems and deficiencies of the prior art, it is therefore an object of the present invention to provide a mask, and preferably a metal mask, for use in patterning substrates, particularly substrates containing a conductive pattern.

It is another object of the present invention to provide a mask suitable for use in making thick film MLC devices.

A further object of the invention is to provide a method for patterning substrates using the mask of the invention.

It is yet another object of the present invention to provide a method of making thick film MLC devices using the mask of the invention.

Still other objects and advantages of the invention will in part be obvious and will in part be apparent from the specification.

SUMMARY OF THE INVENTION

A metal or other material mask for printing a pattern on a printing substrate comprises a sheet, e.g., metal, having a printing pattern thereon comprising through mask openings in the sheet extending from the top face of the sheet to the bottom face of the sheet wherein the mask has one or more flexible tabs interconnecting and bridging one or more of the through mask openings and having a thickness less than the thickness of the mask substrate sheet to allow printing (deposition) material applied to the top face of the sheet to flow through the opening and under the tab during the patterning process and deposit the material on the underlying printing substrate in the desired pattern. The tab is usually and preferably of the same material as the mask and the top surface of the tabs are usually and preferably coplanar with the top surface of the mask and flex when pressure is applied thereto. For some applications, partial through mask openings may be employed.

The flexible tabs of the invention are formed by using a tab structure which provides a bending moment in at least one portion of the tab to distribute the force applied to the mask and the tabs during the patterning process to provide a flexing motion to the tab thereby relieving stresses in the mask and/or tab caused by the patterning operation. In a preferred embodiment, the tab traversing the opening has a step structure whereby one step is attached to one side of the mask opening and another step being attached to the other side of the mask opening and bridging the mask opening. This is to be contrasted with rectangular tabs of the prior art shown in Boudreau supra wherein the rectangular tab is substantially transverse to the sides of the mask opening. Comparing the two type tabs when a force is applied to the mask during the patterning operation, as the paste is caused to flow on the surface of the mask by an advancing squeegee or nozzle and forced into openings in the mask, the step structure tab of the invention or other flexible tab configuration of the invention provides a bending moment in the tab and the tab flexes to relieve the force stresses on the mask and/or tab. The rectangular tab, which bridges both sides of the opening transversely, does not produce such a bending moment and does not have the enhanced flexibility of tabs of the invention and is substantially rigid except for its usual bending moment based on the thickness and width of the tab. The tabs of the invention have an increased flexibility and bending moment than the tabs of the prior art.

The tab of the invention may be generally rectangular and essentially transverse to the opening with a first portion of the tab extending completely across the opening and at least one second portion of the tab extending partially across the opening, the second portion of the tab providing a flexible bending moment in the tab when a force is applied to force the deposition material through the opening to print the pattern on the printing substrate. A step shape tab is exemplary.

In a preferred embodiment, the flexible tabs of the invention are formed using a tab structure which distributes the forces applied to the mask and/or the tabs during the patterning process to provide a flexing motion to the tab and, in addition, contains at least one through opening in the tab to provide additional bending moment and flexibility to the tab structure. The combination of the step shape tab or other flexible tab configuration and at least one through opening in the tab provides enhanced flexing motion to the tab thereby relieving stresses in the mask and/or tab caused by,the patterning operation.

In another aspect of the invention, at least one through opening may be provided in tab designs, e.g., rectangular, to provide tabs of the invention which are flexible compared to conventional tab structures and which offer enhanced mask operating and useful life characteristics. At least one through opening is provided in the tab and a plurality may be used depending on the operating characteristics desired. As with the step tab structure, a first portion of the tab extends completely across the opening and provides no enhanced flexing action for the tab. A second portion of the tab extends transversely partially across the opening until the tab through opening is reached. The second portion of the tab provides a flexible bending moment in the tab when a force is applied to the mask and/or tab.

In another aspect of the invention, the through hole opening in the tab also provides enhanced operational benefits in that the paste or other deposition material which is forced into the mask openings not only flows under the tab but is also forced through the through openings to provide enhanced line or other mask design formation. As noted hereinabove, the through hole in the tab also provides a flexing action in the tab and relieves the stresses caused by the force used to form the mask pattern design.

In accordance with another aspect of this invention, there is provided a method of depositing a pattern on a substrate such as a greensheet used in MLC manufacture. The method comprises the steps of providing a metal mask or other material mask for patterning of the substrate comprising a mask substrate sheet having a printing pattern thereon comprising through openings in the sheet extending from the top face of the sheet to the bottom face of the sheet wherein the sheet has one or more flexible tabs bridging one or more of the openings and having a thickness less than the thickness of the metal sheet to allow patterning material applied to the top face of the sheet to flow into the through openings and under the tab during the patterning process and deposit the material on the underlying printing substrate. For tab structures containing through openings, the deposition material will also flow through the tab openings to form the desired mask pattern.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
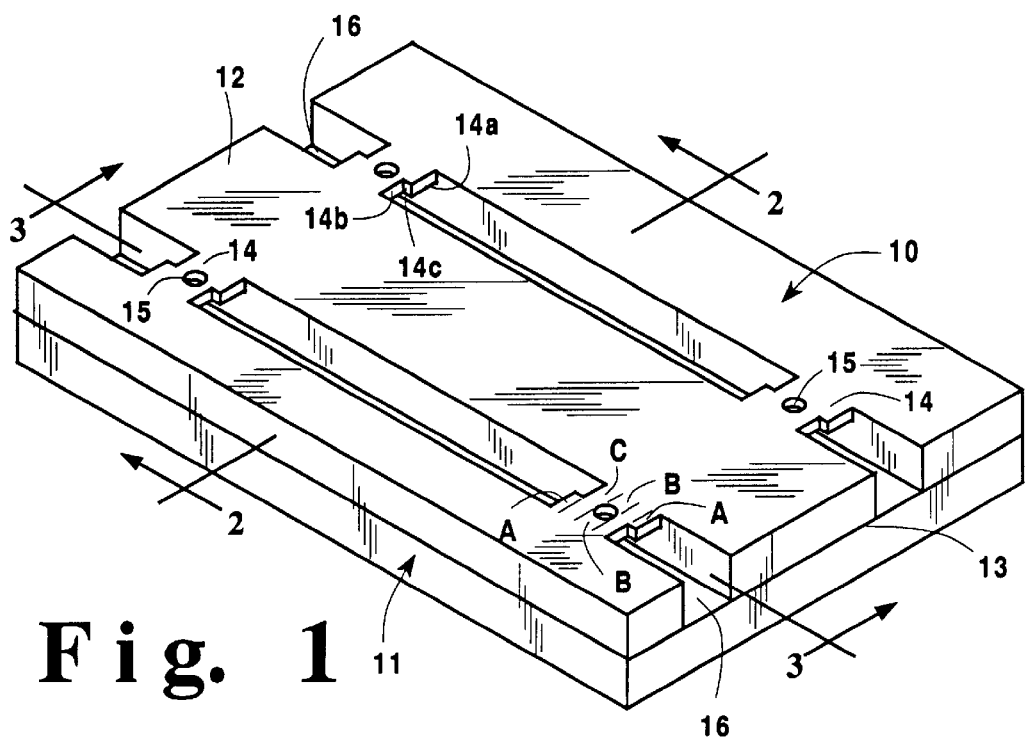
FIG. 1 is an enlarged perspective illustration of a portion of a mask of the invention positioned on a substrate to be pattern printed.

In describing the preferred embodiment of the present invention, reference will be made herein to FIGS. 1–6c of the drawings in which like numerals refer to like features of the invention. Features of the invention are not necessarily shown to scale in the drawings.

With regard to FIG. 1, a partial view of a mask of the invention is shown as 10. The mask is shown positioned on the surface of the printing substrate 11 to be patterned. Conductive paste or other such desired deposition material (not shown) is applied to the top surface 12 of the mask and forced into the mask openings 16 using a squeegee, paste tube or other such means. The substrate 11 can be any material and is usually a ceramic type material such as a greensheet. The mask 10 has top surface 12 and bottom surface 13 which bottom surface is placed on top of substrate 11 forming the pattern to be printed, in this case long lines shown as mask openings 16. The mask is preferably a metal, preferably molybdenum having a thickness of 0.001 to 0.020 inch. Mask openings 16 are shown as long lines which would be formed as continuous lines of deposition material on the surface of the substrate when the deposition material is forced through the mask openings during the deposition process. The mask 10 has flexible bridges or tabs 14 in a step configuration, which tabs have faces 14a, 14b and 14c. The tabs 14 are shown coplanar with the top surface 12 and have tab openings 15 which extend from the top surface 12 through the tab. The tabs 14 can be seen not to extend to the bottom face 13 of mask 10 the thickness of the tabs being thinner than the mask thickness. The reason for this difference in thickness is that when a deposition material is forced into mask opening 16 a continuous line is desired to be formed and the material forced into mask openings 16 flows under bridges or tabs 14 and through tab openings 15 and forms such a continuous line.

It is an important feature of the invention that the flexible tabs 14 have a structure providing flexibility (bending moment) which allows relief of the stresses caused when a force is applied to the mask and/or tab during the deposition process. In the preferred embodiment shown in FIG. 1, a first portion of the tab shown as C extends completely across the mask opening 16. A second portion of the tab shown as A formed by tab faces 14a and 14c extends partially across mask opening 16 e.g., about 10 to 90% preferably 30 to 50% the width of the mask opening 16. A third portion of the tab shown as B extends transversely from both sides of mask opening 16 to through tab opening 15 and like A extends only partially across mask opening 16. This structure also allows the deposition material which is being forced into the mask openings (design) to flow through the tab openings and to provide enhanced flow properties into the mask openings and an enhanced continuous printed substrate 11. When force is applied to the mask and tabs during the deposition process, tab portions A and B produce an enhanced bending moment and flex and relieve stresses in the tab.

Mask 10 may be formed in a number of ways as will be appreciated by those skilled in the art. In a preferred method, a sheet of metal of the thickness desired for the mask is photolithographed on both surfaces—one surface with (tabs) bridges and the other surface without tabs. A differential etch is used to etch part way through the sheet and then the other side is partially etched to form the desired openings in the mask. This procedure provides tabs having a thickness less than the mask thickness and having an opening below the lower tab surface and the bottom surface of the mask 13 for the line to be formed as a continuous line on the substrate 11.

Figure 2:
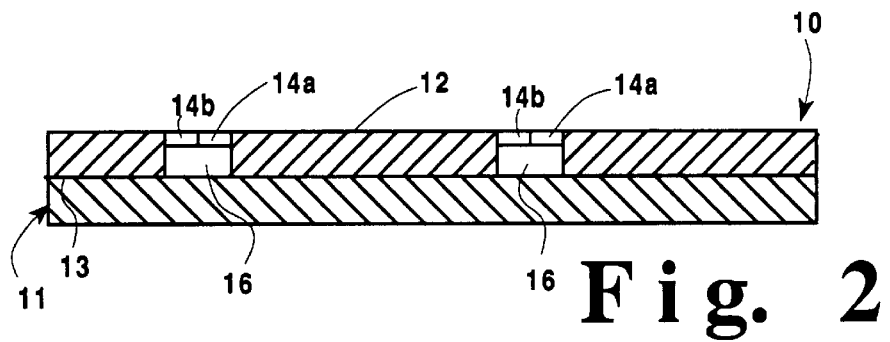
FIG. 2 is a cross-sectional view of FIG. 1 taken along lines 2—2.
Figure 3:
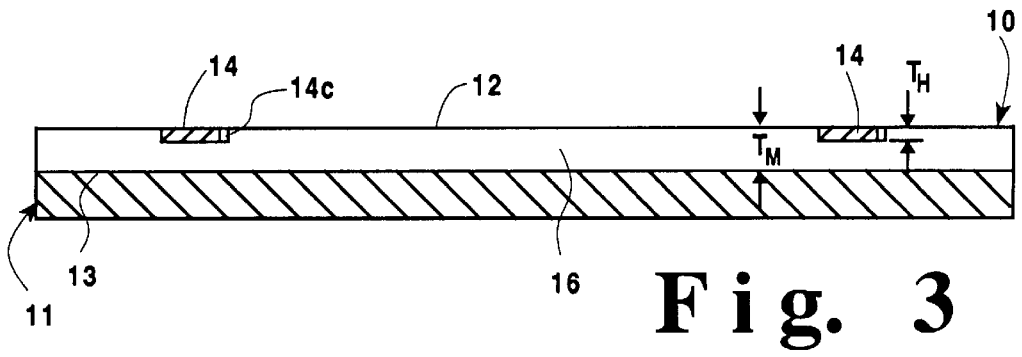
FIG. 3 is a cross-sectional view of FIG. 1 taken along lines 3—3.

With regard to FIG. 2, mask 10 is shown having top surface 12 and bottom surface 13. The substrate to be patterned is shown as 11. Through mask openings 16 are etched in the mask with the mask openings below the tab extending from surface 13 to the bottom of the tabs as shown by tab faces 14a and 14b. In FIG. 3, the tabs are indicated as 14 and tab face 14c. The height of the tab may vary widely and is shown as $T_H$ and the height of the mask 10 is shown as $T_M$. $T_H$ is less than $T_M$ and $T_H$ is usually about 20% to 80% preferably 40%, of the mask height $T_M$.

Figure 4:
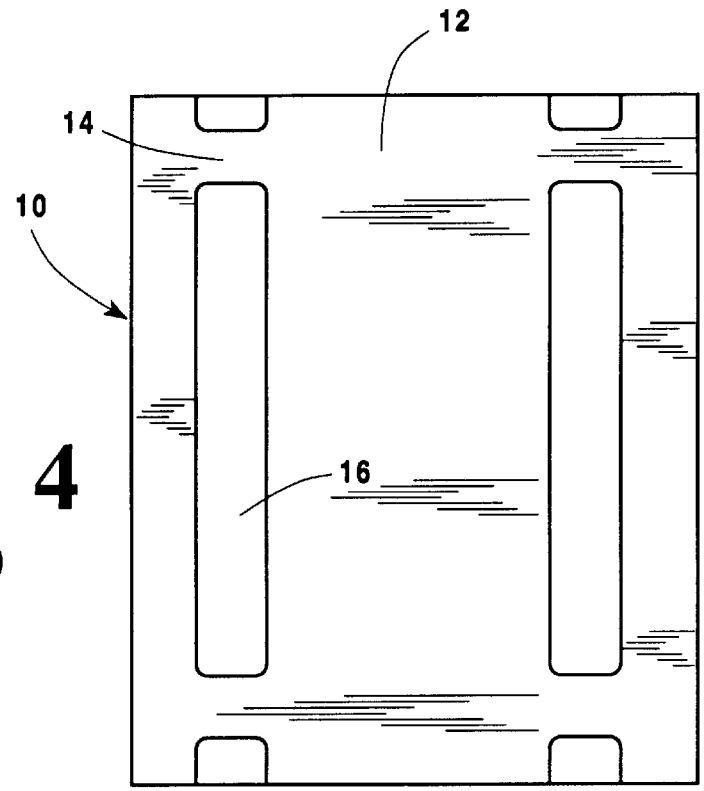
FIG. 4 is an enlarged top view illustration of a portion of a mask of the prior art.

Referring to FIG. 4, an enlarged partial top view of a mask according to the prior art of Boudreau U.S. Pat. Nos. 4,615,781 and 4,715,940 supra, is shown. In this design, mask 10, having top surface 12 is shown as having mask openings 16 forming a long continuous line which are bridged by tabs 14. The top of the tabs 14 are coplanar with the top surface 12. The tabs are essentially transverse to the longitudinal axis of the openings 16. It has been found that these type tabs are prone to breaking during the paste application and deposition process.

Figure 5:
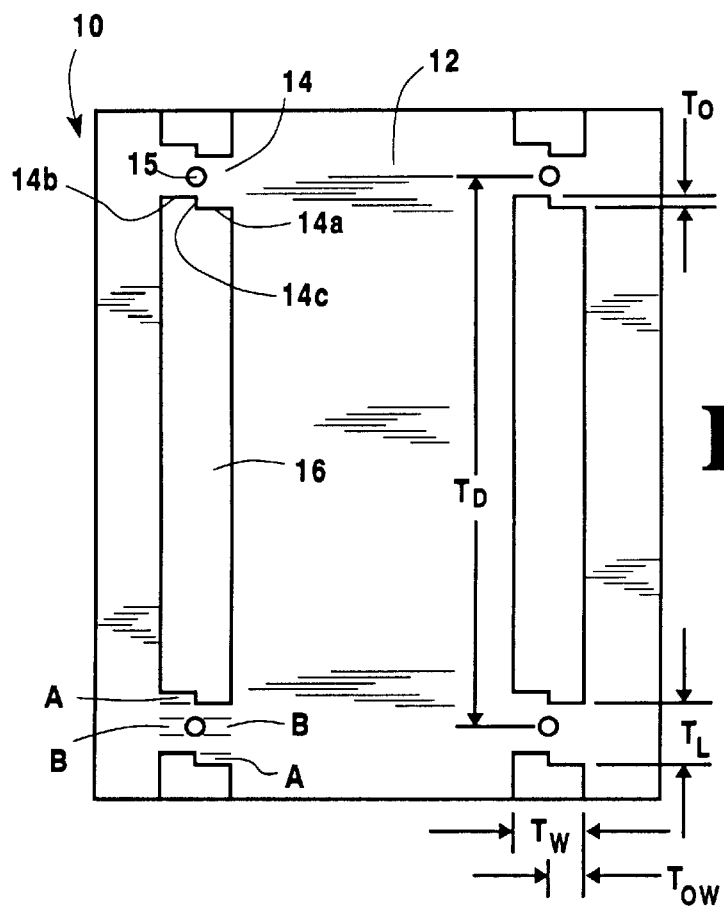
FIG. 5 is an enlarged top view illustration of a portion of a mask of the invention.

In contrast to the mask of the prior art, FIG. 5 shows an enlarged partial top view of a mask of the invention. Thus, mask 10 having top surface 12 is shown having mask openings 16 and tabs 14. The mask openings 16 form a long continuous line. The tabs 14 are of a step shape as in FIG. 1 which when force is applied to the mask to force material applied to surface 12 into the mask openings 16, the tabs flex and are more resistant to breaking then conventional rectangular tabs. For example, if a squeegee is traveling over tab 14, the part of the tab formed by tab faces 14a and 14c (A) will flex because tab face 14a does not extend to the other side of opening 16 and a bending moment in the tab is formed. Likewise for the portion of the tabs transverse to through tab openings 15 (B). The tabs 14 are shown having a length $T_L$ and a width $T_W$. The width of the tab is substantially the same as the width of the line (mask opening 16) which is to be formed. The size of the tab length offset (step) is indicated as $T_O$ and $T_{OW}$ represents the width of the step of the tab. The distance between adjacent tab center lines is shown as $T_D$. The tabs have through tab openings 15.

While the size of the tabs and number of tabs may vary widely depending on the application and design to be printed for an exemplary mask having a line width of about 0.0028 inch, $T_W$ is therefore about 0.0028 inch. A preferred $T_D$ is about 0.009 to 0.030 inch, preferably 0.0197 inch. Tab offset length $T_O$ is about 0.0002 to 0.001 inch, preferably 0.0005 inch and $T_{OW}$ is about 0.0003 to 0.0014 inch, preferably 0.0012 inch. A ratio of $T_O$ to $T_L$ is about 1:20 to 1:4. $T_L$ is about 0.004 inch. Through tab openings 15 are about 0.0005 to 0.0025 inch, preferably 0.0025 inch. The above dimensions have been found to provide a mask having a long operating life and excellent operating characteristics for any of a number of patterning processes such as squeegee, paste nozzle, etc. and lower and higher values may be used depending on the desired mask.

Figure 6A:
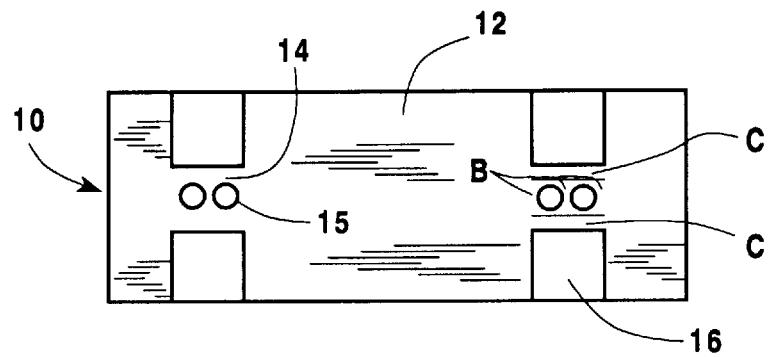
FIGS. 6a, 6b and 6c are enlarged top view illustrations of a portion of masks of the invention.
Figure 6B:
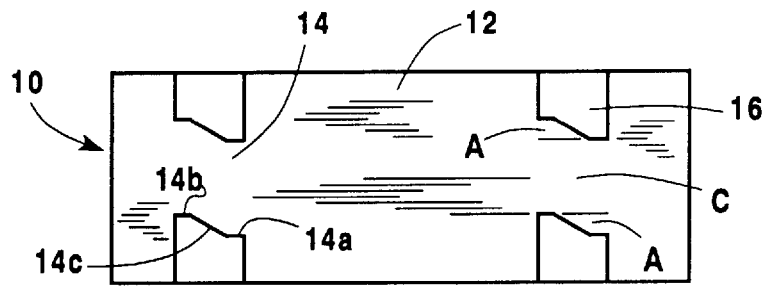
Figure 6C:
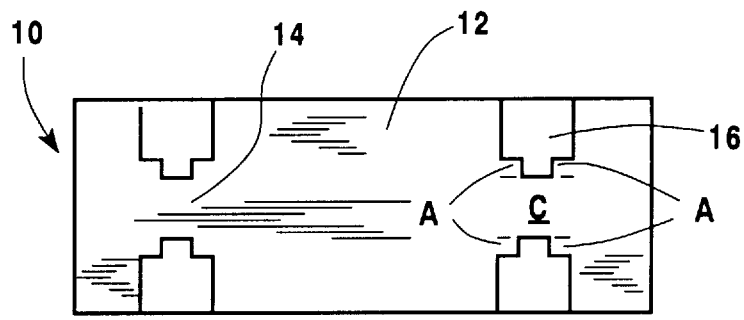

FIGS. 6a, 6b and 6c show other tab structures of the invention. Thus, in FIG. 6a, the tab 14 while substantially transverse to the longitudinal axis of the opening 16 as in the prior art has two through tab openings 15 which provide flexibility to the tab as shown by portions B and enhanced operational and operating life characteristics. In FIG. 6b, the tab 14 is similar to the step tab shown in FIG. 5 except that it has a face 14c which is angled relative to 14a and 14b. Tab portions A provide a flexing action in the tab compared to tab portion C. FIG. 6c shows tab 14 to have an H configuration with tab portions A providing a flexing action to the tab compared to tab portion C.

Through tab openings 15 are shown in FIGS. 1, 5 and 6a. As noted above, these tab openings provide not only flexing action for the tab but also provide enhanced patterning operating characteristics because the material to be screened and deposited on the substrate not only flows under the tab during the deposition process but also flows through tab opening 15 to provide enhanced line deposition formation. While tab openings 15 are shown as circular, any suitable design may be used and a plurality of such openings may also be employed. The ratio of the area of the tab openings to the surface area of the tab is about 1:8 to 1:2. FIGS. 6b and 6c are shown not having through openings 15 and such a design may be desired for certain applications. Other designs may be used to form the tabs of the invention. The preferred mask embodiment comprises a flexible tab having both a step shape structure and at least one through tab hole opening to provide enhanced tab flexibility and deposition material flow during the deposition process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for printing a pattern of a deposition material on a printing substrate using a mask comprising:

positioning the mask on the printing substrate the mask comprising:

a mask substrate in the form of a sheet having a printing pattern thereon in the form of through openings in the mask substrate extending from the top face of the mask substrate to the bottom face of the mask substrate; and one or more interconnecting tabs bridging one or more of the through openings, each tab having a thickness less than the thickness of the mask substrate and wherein at least one tab has at least one through tab opening therein which said tab opening provides a bending moment in at least one portion of the tab so that when a force is applied to the tab, the bending moment causes the tab to flex;

applying the deposition material to the surface of the mask substrate;

forcing the deposition material through the through openings of the mask substrate to form the mask pattern on the printing substrate; and removing the mask substrate from the printing substrate.

2. The method of claim 1 wherein the deposition material is forced through the through openings using a deposition nozzle or a squeegee.

3. The method of claim 1 wherein the tab is essentially rectangular.

4. The method of claim 1 wherein the tab has a step shape wherein a first portion of the tab extends completely across the through opening and at least one second portion of the tab extends partially across the through opening, the second portion of the tab providing a flexible bending moment in the tab when a force is applied to the mask substrate to force the deposition material through the through opening to print the pattern on the printing substrate.

5. The method of claim 1 wherein the thickness of each tab is about 20–80% of the thickness of the mask substrate.

6. A method for printing a pattern of a deposition material on a printing substrate using a mask comprising:

positioning the mask on the printing substrate, the mask comprising:

a mask substrate in the form of a sheet having a printing pattern thereon in the form of through openings in the mask substrate extending from the top face of the mask substrate to the bottom face of the mask substrate; and one or more interconnecting tabs bridging one or more of the through openings, each tab having a thickness less than the thickness of the mask substrate and wherein at least one tab has a step shape wherein a first portion of the tab extends completely across the opening and at least one second portion of the tab extends partially across the opening, the second portion of the tab providing a flexible bending moment in the tab when a force is applied to the mask to force the deposition material through the opening to print the pattern on the printing substrate;

applying the deposition material to the surface of the mask substrate;

forcing the deposition material through the through mask openings of the mask substrate to form the mask pattern on the printing substrate; and removing the mask substrate from the printing substrate.

7. The method of claim 6 wherein the second portion of a tab having a step shape extends about 5–50% across the mask opening.

8. The method of claim 7 wherein the ratio of the length of the second portion of the tab to the length of the first portion of the tab is about 1:20 to 1:4.

9. The method of claim 8 wherein the area of the through tab opening to the surface area of the tab is about 1:8 to 1:2.

10. The method of claim 6 wherein the tab forms an H-shaped step configuration with two second portions of the tab on each side of the first portion, each of second portions extending partially across the opening from opposite sides of the opening.

11. The method of claim 6 wherein a portion of the edge of the second portion of the tab extends angularly and intersects the edge of the first portion of the tab.

* * * * *